(12) United States Patent
Ishikawa et al.

(10) Patent No.: US 8,737,937 B2
(45) Date of Patent: May 27, 2014

(54) DISTORTION COMPENSATION APPARATUS, TRANSMITTER, AND DISTORTION COMPENSATION METHOD

(75) Inventors: Hiroyoshi Ishikawa, Yokohama (JP); Kazuo Nagatani, Yokohama (JP); Nobukazu Fudaba, Yokohama (JP)

(73) Assignee: Fujitsu Limited, Kawasaki (JP)

( * ) Notice: Subject to any disclaimer, the term of this patent is extended or adjusted under 35 U.S.C. 154(b) by 95 days.

(21) Appl. No.: 13/542,368

(22) Filed: Jul. 5, 2012

(65) Prior Publication Data
US 2013/0015917 A1    Jan. 17, 2013

(30) Foreign Application Priority Data
Jul. 14, 2011    (JP) ................................. 2011-155970

(51) Int. Cl.
*H04B 1/04*    (2006.01)

(52) U.S. Cl.
USPC ...................... 455/114.3; 455/115.1; 375/296

(58) Field of Classification Search
CPC ............... H04B 2001/0425; H04B 2001/0433; H03F 1/3247; H04L 27/368
USPC .............. 455/114.3, 115.1; 330/149; 375/296
See application file for complete search history.

(56) References Cited

U.S. PATENT DOCUMENTS

| | | | |
|---|---|---|---|
| 5,867,065 A * | 2/1999 | Leyendecker | ................. 330/149 |
| 7,020,447 B2 * | 3/2006 | Nagatani et al. | ........... 455/114.3 |
| 7,583,754 B2 | 9/2009 | Liu | |
| 8,159,297 B2 * | 4/2012 | Kumagai | ...................... 330/149 |
| 8,384,477 B2 * | 2/2013 | Matsubara et al. | ........... 330/149 |
| 8,461,925 B2 * | 6/2013 | Matsubara et al. | ........... 330/149 |

FOREIGN PATENT DOCUMENTS

| | | |
|---|---|---|
| JP | 2006-505160 | 2/2006 |
| JP | 4086133 | 5/2008 |
| WO | WO-01/08320 | 2/2001 |
| WO | WO-2004/040870 | 5/2004 |

OTHER PUBLICATIONS

Hardik Gandhi, "A Flexible Volterra-Based Adaptive Digital Pre-Distortion Solution for Wideband RF Power Amplifier Linearization", Aug. 2008.

* cited by examiner

*Primary Examiner* — Sonny Trinh
(74) *Attorney, Agent, or Firm* — Fujitsu Patent Center

(57) ABSTRACT

A distortion compensation apparatus includes an amplifying unit, a plurality of distortion compensation coefficient storage units, a first address generating unit, a second address generating unit, and a distortion compensating unit. The amplifying unit amplifies an input signal. A plurality of distortion compensation coefficient storage units store the distortion compensation coefficients for compensating for the distortion of the amplifying unit by being associated with two different addresses. The first address generating unit generates a first address based on the current input signal. The second address generating unit generates a second address different from the first address based on the previous input signal. The distortion compensating unit obtains the distortion compensation coefficient corresponding to a combination of the first and second addresses from each of the distortion compensation coefficient storage units and performs a pre-distortion processing for the current input signal to the amplifying unit using the obtained distortion compensation coefficient.

12 Claims, 14 Drawing Sheets

DISTORTION COMPENSATION APPARATUS, TRANSMITTER, AND DISTORTION COMPENSATION METHOD

CROSS-REFERENCE TO RELATED APPLICATION

This application is based upon and claims the benefit of priority of the prior Japanese Patent Application No. 2011-155970, filed on Jul. 14, 2011, the entire contents of which are incorporated herein by reference.

FIELD

The embodiments discussed herein are directed to a distortion compensation apparatus, a transmitter, and a distortion compensation method.

BACKGROUND

In recent years, as radio communication increases in speed, high-efficiency transmission through digitalization has been employed. Under such a situation, a power amplifier is demanded to have high linearity in order to suppress degradation in signal quality. At the same time, from the viewpoint of miniaturization of the apparatus, reduction of operational cost, and the like, the power amplifier is highly demanded to operate with high power conversion efficiency. In general, there is a tradeoff relation between the linearity and the power conversion efficiency in the power amplifier.

In this regard, in order to achieve both the linearity and the power conversion efficiency, there is known a technique in which the power amplifier is operated in a non-linear area having high power conversion efficiency while linearity is maintained using distortion compensation for removing a nonlinear distortion generated at that time. A pre-distortion type technique (hereinafter, referred to as a "PD" type) as a sort of the distortion compensation improves linearity in the output of the power amplifier by configuring to have an anti-nonlinear distortion characteristic of the power amplifier in the transmission signal in advance. As an example of the PD type technique of the related art, there is known a power-series distortion compensation technique in which the anti-nonlinear distortion characteristic of the power amplifier is approximated using a power series.

Here, there is known a phenomenon called a memory effect which is generated in the power amplifier that operates with high power exchange efficiency. The memory effect is a phenomenon in which an output in response to an input of the power amplifier at certain timing is influenced by the previous input and includes an electric memory effect caused by an electric transient response of the power amplifier and a thermal memory effect caused by a thermal characteristic of the power amplifier. Due to such a memory effect, it is difficult to obtain a desired distortion suppression effect when the PD type distortion compensation is performed using a power series, in which the distortion compensation coefficient is determined only based on the current signal amplitude value or power value. In this regard, there has been proposed a PD type distortion compensation using the power series, in which the previous input signal is taken into consideration in addition to the current input signal in order to obtain a desired distortion suppression effect in the power amplifier that operates with high power efficiency. Furthermore, there has been proposed a PD type distortion compensation using a look-up table (LUT) for storing distortion compensation coefficients of the power series in order to reduce the number of computations for the power series.

Patent Literature 1: Japanese Patent No. 4086133
Patent Literature 2: Japanese National Publication of International Patent Application No. 2006-505160
Non-Patent Literature 1: A Flexible Volterra-Based Adaptive Digital Pre-Distortion Solution for Wideband RF Power Amplifier Linearization, Hardik Gandhi, Tex. Instruments, Palo Alto, Calif. 94306, USA However, in the related art described above, it is difficult to appropriately perform distortion compensation while suppressing an increase in a circuit scale. For example, in the related art that uses the power series, a delay amount as a parameter of the power series increases as the distortion suppression effect increases in principle. For this reason, the number of delay circuits affecting the delay amount increases. This results in an increase in a circuit scale. This is similarly applied to the related art that uses the LUT. Furthermore, as the delay amount of the power series increases, the number of distortion compensation coefficients increases. Therefore, it is difficult to cause the distortion compensation coefficient to converge on an optimal value because the number of distortion compensation coefficients increases as the delay amount of the power series increases. This may degrade the distortion suppression performance.

In addition, in the related art using the LUT, a distortion compensation coefficient corresponding to a combination of the previous input signal and the current input signal input to the power amplifier is obtained from a single LUT, and the pre-distortion processing is performed using a single distortion compensation coefficient. Therefore, the distortion suppression performance may be insufficient.

SUMMARY

According to an aspect of an embodiment of the invention, a distortion compensation apparatus includes an amplifying unit that amplifies an input signal; a plurality of distortion compensation coefficient storage units that store distortion compensation coefficients for compensating for a distortion of the amplifying unit by being associated with two different addresses; a first address generating unit that generates a first address based on a current input signal which is the input signal to be currently input to the amplifying unit; a second address generating unit that generates a second address different from the first address based on a previous input signal which is the input signal to be previously input to the amplifying unit; and a distortion compensating unit that obtains the distortion compensation coefficient corresponding to a combination of the first and second addresses from each of the distortion compensation coefficient storage units and performs a pre-distortion processing for the current input signal to be input to the amplifying unit using the obtained distortion compensation coefficient.

The object and advantages of the embodiment will be realized and attained by means of the elements and combinations particularly pointed out in the claims.

It is to be understood that both the foregoing general description and the following detailed description are exemplary and explanatory and are not restrictive of the embodiment, as claimed.

DESCRIPTION OF EMBODIMENTS

Preferred embodiments of the present invention will be explained with reference to accompanying drawings.

In the following embodiments, an example will be described for a case where the distortion compensation apparatus according to the invention is applied to a transmitter for transmitting signals. However, the invention is not limited to the distortion compensation apparatus, the transmitter, and the distortion compensation method disclosed herein.

[a] First Embodiment

Figure 1:
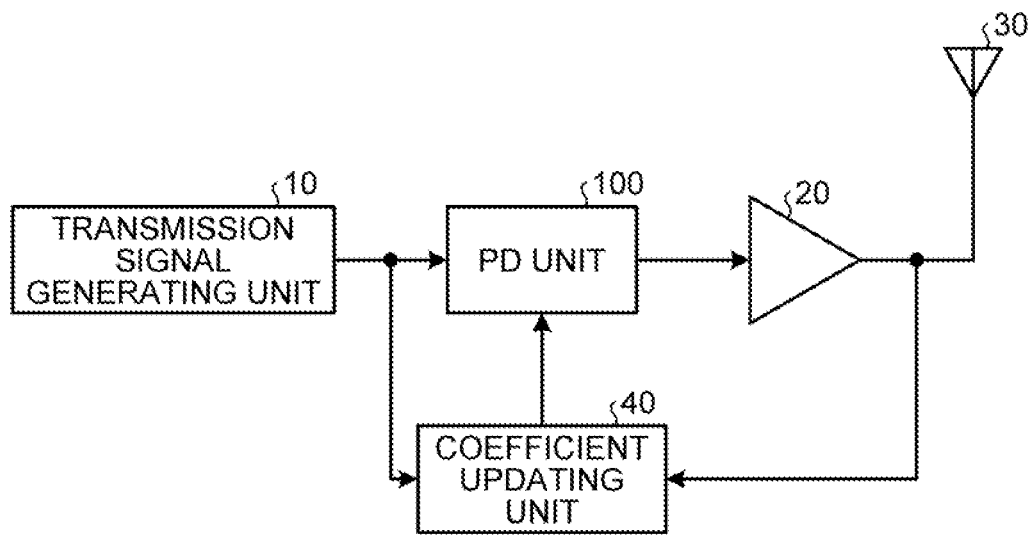
FIG. 1 is a diagram illustrating an exemplary configuration of a transmitter according to a first embodiment.

FIG. 1 is a diagram illustrating an exemplary configuration of the transmitter according to a first embodiment. As illustrated in FIG. 1, a transmitter according to the present embodiment includes a transmission signal generating unit 10, a pre-distortion (PD) unit 100, a power amplifier 20, an antenna 30, and a coefficient updating unit 40.

The transmission signal generating unit 10 generates a transmission signal and outputs the generated transmission signal to the PD unit 100 and the coefficient updating unit 40.

The PD unit 100 performs a pre-distortion (PD) processing for the transmission signal to be input from the transmission signal generating unit 10. In addition, the PD unit 100 outputs the transmission signal (hereinafter, referred to as a PD signal) subjected to the PD processing to the power amplifier 20. Here, if it is assumed that x(t) denotes the transmission signal input from the transmission signal generating unit 10, the PD signal PD(t) can be expressed in Equation (1) as follows.

$$PD(t) = \sum_{i=0}^{Delay} \sum_{j=0}^{Delay} \sum_{k=0}^{N} h_{i,j,k} |x(t-j)|^k x(t-i) \quad (1)$$

$$= \sum_{i=0}^{Delay} \sum_{j=0}^{Delay} LUT_{i,j}(|x(t-j)|)x(t-i)$$

where "$h_{i,j,k}$" denotes coefficient of Volterra series, "Delay" denotes delay amount and "$LUT_{i,j}(|x(t-j)|)$" denotes Distortion compensation coefficient.

The power amplifier 20 amplifies the PD signal input from the PD unit 100. In addition, the output signal output from the power amplifier 20 is divided into two signals using a coupler and the like. Then, one of the divided output signals is output to the antenna 30, and the other one is output to the coefficient updating unit 40 as a feedback signal. The antenna 30 radiates the output signal input from the power amplifier 20 to space.

The coefficient updating unit 40 receives the transmission signal input from the transmission signal generating unit 10 and the feedback signal input from the power amplifier 20. In addition, the coefficient updating unit 40 updates the distortion compensation coefficient stored in an LUT unit 130 of the PD unit 100 described below using an LMS algorithm such that power of an error signal as a difference between the transmission signal and the feedback signal is minimized.

Figure 2:
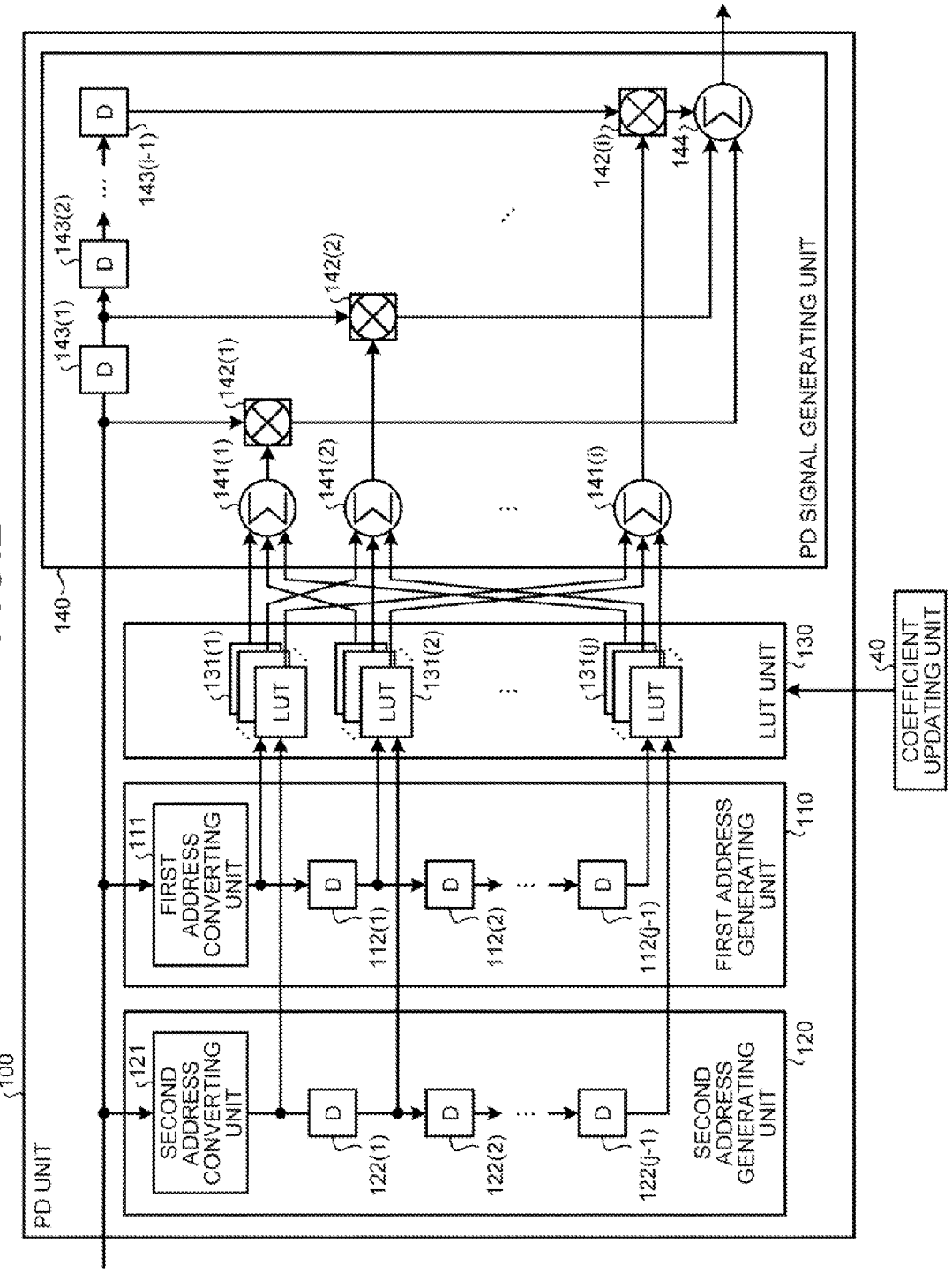
FIG. 2 is a diagram illustrating the configuration of a PD unit according to the first embodiment in detail.

Next, a configuration of the PD unit 100 according to the present embodiment will be described in detail with reference to FIG. 2. FIG. 2 is a diagram illustrating the configuration of the PD unit according to the first embodiment in detail. The PD unit 100 includes a first address generating unit 110, a second address generating unit 120, the LUT unit 130, and a PD signal generating unit 140. The first address generating unit 110, the second address generating unit 120, the LUT unit 130, and the PD signal generating unit 140 of the PD unit 100 and the power amplifier 20 constitute an exemplary of "distortion compensation apparatus."

The first address generating unit 110 generates a first address of the LUT unit 130 based on the current transmission signal. Specifically, the first address generating unit 110 has a first address converting unit 111 and (j−1) delay circuits 112(1) to 112(j−1). The first address converting unit 111 converts the current transmission signal x(t) into a value obtained by substituting an absolute value |x(t)| of the current transmission signal x(t) input from the transmission signal generating unit 10 with a predetermined function f1.

The value output from the first address converting unit 111 is sequentially delayed in each of the delay circuits 112(1) to 112(j−1) by unit time. In addition, a total of (j) output values obtained by summing the output value of the first address converting unit 111 and the (j−1) output values of the delay circuits 112(1) to 112(j−1) are output to the LUT unit 130 as a first address.

The second address generating unit 120 generates a second address of the LUT unit 130 based on the previous transmission signal. Specifically, the second address generating unit 120 includes a second address converting unit 121 and (j−1) delay circuits 122(1) to 122(j−1). The second address converting unit 121 converts the previous transmission signal x(t−d) (d is an integer) into a value obtained by substituting the absolute value |x(t−d)| of the previous transmission signal x(t−d) with a predetermined function f2.

For example, the second address converting unit 121 executes a simple moving average processing for the power value of the previous transmission signal x(t−d) to compute a simple moving average value. Here, if it is assumed that the power value of the previous transmission signal x(t−d) is {x(t−d)}², the simple moving average value can be expressed in Equation (2) as follows.

$$\sum_{d=0}^{M} \{x(t-d)\}^2 \quad (2)$$

where "M" is a parameter set with the thermal memory effect taking into consideration.

For example, the second address converting unit 121 may compute a weighted moving average value obtained by executing a weighted moving average processing in which a higher weight is given to the power value of the previous transmission signal x(t−d) as time approaches to a timing of the current transmission signal x(t). Here, if it is assumed that the power value of the previous transmission signal x(t−d) is {x(t−d)}², the weighted moving average value can be expressed in Equation (3) as follows.

$$\sum_{d=0}^{M} \alpha(d)\{x(t-d)\}^2 \quad (3)$$

where "M" is a parameter set with the thermal memory effect taking into consideration.

Figure 3:
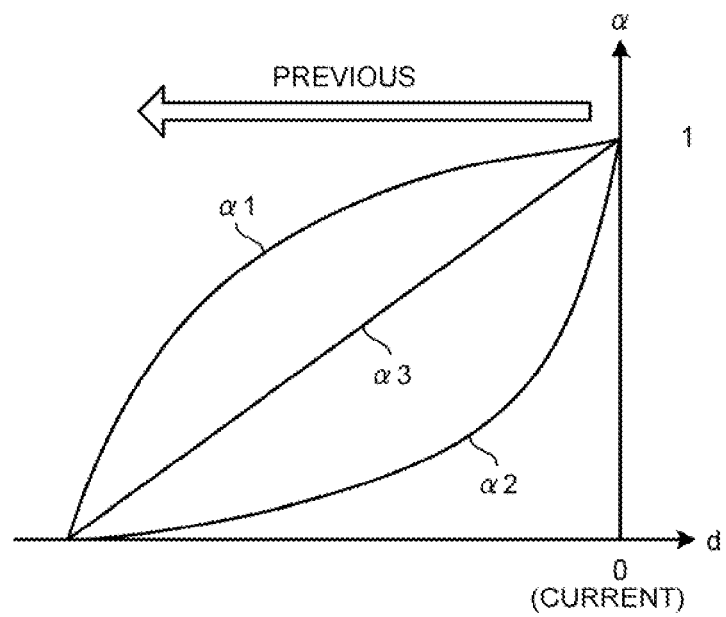
FIG. 3 is a diagram illustrating an exemplary weight function α(d)

Here, α(d) included in Equation (3) denotes a weight function. The value of the weight function α(d) increases as time d approaches to the current timing 0. An exemplary weight function α(d) is illustrated in FIG. 3. As indicated by the curves α1 or α2 or the straight line α3 in FIG. 3, the value of the weight function α(d) increases as time d approaches to the current timing 0. As a result, the second address of the LUT unit 130 tends to be weighted as the previous signal is close in time to the current signal. Therefore, it is possible to efficiently suppress generation of the thermal memory effect that may increase as time approaches to the current timing.

Returning to FIG. 2, the value output from the second address converting unit 121 is sequentially delayed in each of the delay circuits 122(1) to 122(j−1) by unit time. In addition, a total of (j) output values obtained by summing the output value of the second address converting unit 121 and the output values of the (j−1) delay circuits 122(1) to 122(j−1) are output to the LUT unit 130 as a second address.

The LUT unit 130 has a plurality of LUTs that store distortion compensation coefficients $LUT_{i,j}$ (|x(t−j)|) for compensating for a distortion of the power amplifier 20 by being associated with the first and second addresses. Specifically, the LUT unit 130 has (j) LUT groups 131(1) to 131(j), each of which has (i) LUTs. For each of the (j) LUT groups 131(1) to 131(j), a total of (j) first addresses are supplied from the first address generating unit 110, and a total of (j) second addresses are supplied from the second address generating unit 120. As a result, from each of the (j) LUT groups 131(1) to 131(j), (i) distortion compensation coefficients corresponding to a combination of the first and second addresses are read and supplied to the (i) adders 141(1) to 141(i) of the PD signal generating unit 140.

The PD signal generating unit 140 performs a PD processing for the transmission signal x(t) input to the power amplifier 20 using the distortion compensation coefficient input from the LUT unit 130 to generate the PD signal PD(t). Specifically, the PD signal generating unit 140 includes (i) adders 141(1) to 141(i), (i) multipliers 142(1) to 142(i), (i−1) delay circuits 143(1) to 143(i−1), and an adder 144.

The adder 141(1) computes a total sum of the (j) distortion compensation coefficients supplied from the first LUT of the LUT groups 131(1) to 131(j), and the computed total sum of the distortion compensation coefficients is supplied to the multiplier 142(1). Similarly, each of the adders 141(2) to 141(i) computes a total sum of the (j) distortion compensation coefficients supplied from the second to (i)th LUTs of the LUT groups 131(1) to 131(j), and the computed total sum of the distortion compensation coefficients is supplied to the multipliers 142(2) to 142(i). In addition, the transmission signal x(t) input from the transmission signal generating unit 10 is supplied to the multiplier 142(1), and the transmission signal sequentially delayed in the delay circuits 143(1) to 143(i−1) by unit time is supplied to the multipliers 142(2) to 142(i). Hereinafter, considering the original transmission signal x(t) as a signal delayed by 0, the (i) signals including the (i−1) signals sequentially delayed in the delay circuits 143(1) to 143(i−1) and the original transmission signal are called delayed signals.

Each of the multipliers 142(1) to 142(i) performs complex multiplication between the total sum of the distortion compensation coefficients input from the adders 141(1) to 141(i) and the delayed signals to output the (i) multiplication results to the adder 144.

The adder 144 adds the (i) multiplication results input from the multipliers 142(1) to 142(i) to generate the PD signal PD(t) expressed in Equation (1) described above. In addition, the adder 144 outputs the generated PD signal PD(t) to the power amplifier 20. This PD signal PD(t) has an anti-nonlinear distortion characteristic of the power amplifier 20. Therefore, the PD signal PD(t) can suppress a nonlinear distortion of the power amplifier 20. Furthermore, the PD signal PD(t) is generated by executing a PD processing using a plurality of distortion compensation coefficients corresponding to a combination of the previous signal and the current signal input to the power amplifier 20. Therefore, the PD signal PD(t) can suppress a distortion of the power amplifier 20 generated by a memory effect in which the output for the input of the power amplifier 20 at a certain timing is influenced by the previous input and, in particular, a distortion of the power amplifier 20 generated by a thermal memory effect.

In FIGS. 1 and 2, the power amplifier 20 is implemented using an analog circuit. In addition, the transmission signal generating unit 10, the coefficient updating unit 40, and the PD unit 100 are implemented using a DSP, a CPU, a memory, and the like.

Figure 4:
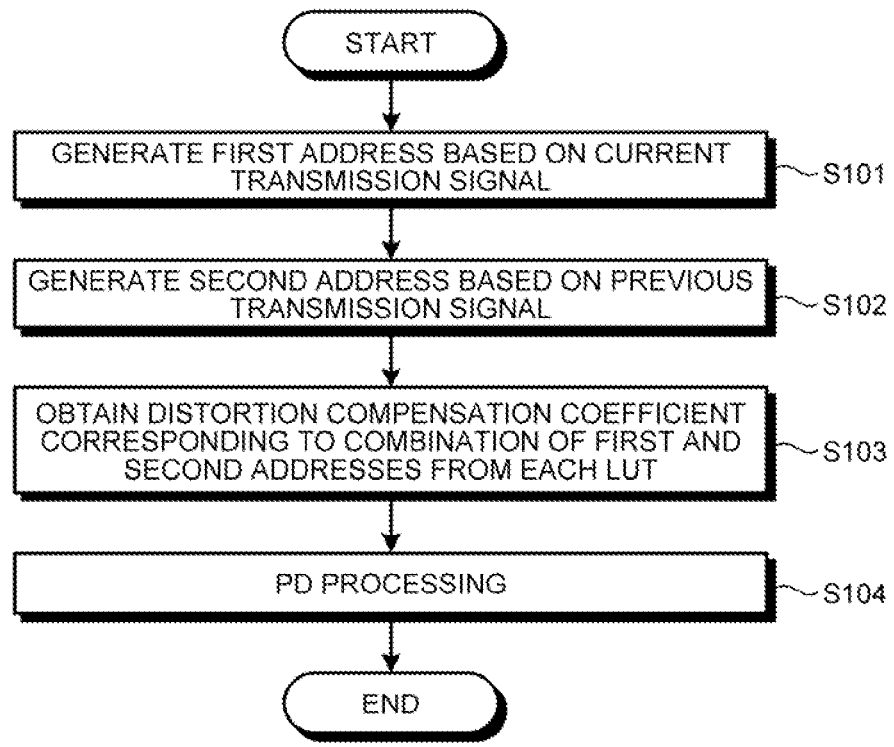
FIG. 4 is a flowchart illustrating a processing sequence of a distortion compensation processing using a transmitter according to the first embodiment.

Next, a processing sequence of the distortion compensation processing using the transmitter according to the present embodiment will be described with reference to FIG. 4. FIG. 4 is a flowchart illustrating a processing sequence of the distortion compensation processing using the transmitter according to the first embodiment.

As illustrated in FIG. 4, the first address generating unit 110 of the PD unit 100 generates the first address based on the current transmission signal input from the transmission signal generating unit 10 (step S101). In addition, the second address generating unit 120 generates the second address based on the previous transmission signal (step S102).

In addition, the PD signal generating unit 140 obtains the distortion compensation coefficient corresponding to a combination of the first and second addresses from each LUT of the (j) LUT groups 131(1) to 131(j) (step S103). That is, for each of the (j) LUT groups 131(1) to 131(j), a total of (j) first addresses are supplied from the first address generating unit 110, and a total of (j) second addresses are supplied from the second address generating unit 120. As a result, the (i) distortion compensation coefficients corresponding to a combination of the first and second addresses are read from each of the (j) LUT groups 131(1) to 131(j) and are supplied to the (i) adders 141(1) to 141(i) of the PD signal generating unit 140.

In addition, the PD signal generating unit 140 performs the PD processing for the transmission signal x(t) input to the power amplifier 20 using the distortion compensation coefficient input from the LUT unit 130 to generate the PD signal PD(t) (step S104).

As described above, the transmitter according to the present embodiment generates the first address based on the current transmission signal input to the power amplifier 20 and generates the second address based on the previous transmission signal. In addition, the transmitter according to the present embodiment obtains the distortion compensation coefficient corresponding to a combination of the first and second addresses from each of a plurality of LUTs and performs the PD processing for the transmission signal input to the power amplifier 20 using the obtained distortion compensation coefficient. For this reason, it is possible to perform the PD processing using a plurality of distortion compensation coefficients corresponding to a combination of the current and previous signals input to the power amplifier 20 with high precision and suppress a distortion of the power amplifier 20 generated by a thermal memory effect caused by the previous input. Therefore, unlike the related art in which a power series or the LUT is used, it is possible to suppress degradation of distortion suppression performance without increasing a delay amount. As a result, it is possible to appropriately compensate for a distortion while suppressing an increase in a circuit scale.

The transmitter according to the present embodiment generates, as the second address, a simple moving average value obtained by executing a simple moving average processing for the power value of the previous transmission signal. For this reason, it is possible to reflect the trend of the previous signal on the second address. Therefore, it is possible to appropriately obtain the distortion compensation coefficient corresponding to a combination of the current and previous signals from the LUT and suppress a distortion caused by generation of a thermal memory effect with high precision.

In addition, the transmitter according to the present embodiment generates, as the second address, the weighted moving average value obtained by executing a weighted moving average processing for the power value of the previous transmission signals such that the weight increases as time approaches to a timing of the current transmission signal. For this reason, it is possible to reflect a trend that a weight to the previous signal increases as time approaches to the current signal timing on the second address. Therefore, it is possible to suppress generation of the thermal memory effect that increases as time approaches to a timing of the current signal with high precision.

[b] Second Embodiment

The second embodiment is different from the first embodiment in that generation of the second address is aborted when the bandwidth of the transmission signal is equal to or greater than a predetermined threshold value. In this regard, hereinafter, description will be mainly made for an example in which generation of the second address is aborted when the bandwidth of the transmission signal is equal to or greater than a predetermined threshold value.

Figure 5:
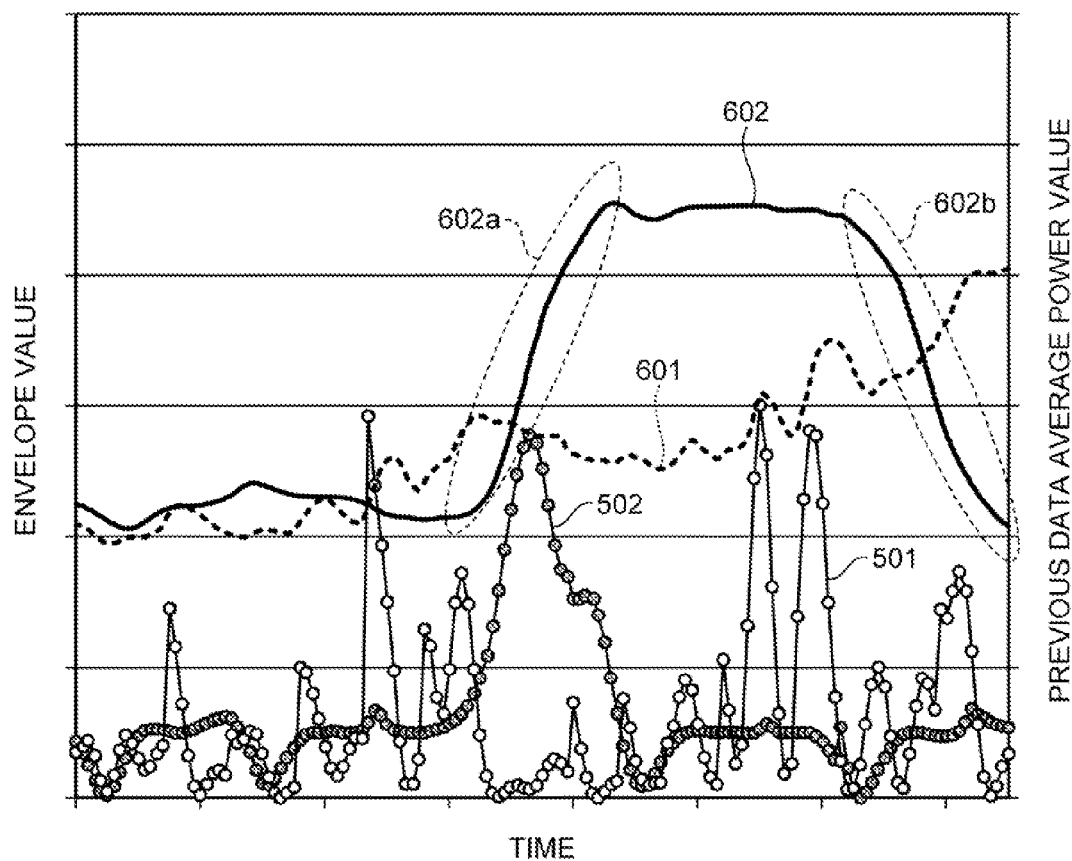
FIG. 5 is a diagram illustrating an envelope value of a transmission signal and a temporal history of a previous data average power value.

First, a reason that generation of the second address is aborted when the bandwidth of the transmission signal is equal to or greater than a predetermined threshold value will be described with reference to FIG. 5. FIG. 5 is a diagram illustrating a temporal history of the previous data average power value and the envelope value of the transmission signal. In FIG. 5, the abscissa denotes time, the left ordinate denotes the envelope value, and the right ordinate denotes the previous data average power value. The previous data average power value is a value obtained by averaging signal power values at a predetermined time.

An waveform 501 indicates a temporal history of the envelope of the transmission signal (hereinafter, referred to as a "wide-band signal") having a bandwidth equal to or greater than a predetermined threshold value. An waveform 502 indicates a temporal history of the envelope of the transmission signal (hereinafter, referred to as a "narrow-band signal") having a bandwidth smaller than a predetermined threshold value. An waveform 601 indicates a temporal history of the previous data average power value of the wide-band signal obtained from the envelope of the wide-band signal indicated by the waveform 501. An waveform 602 indicates the previous data average power value of the narrow-band signal obtained from the envelope of the narrow-band signal indicated by the waveform 502.

In the previous data average power value of the narrow-band signal indicated by the waveform 602, there are a change portion 602a and a change portion 602b that abruptly change in comparison with the previous data average power values of the wide-band signal indicated by the waveform 601. Here, it is known that a distortion caused by the influence of the thermal memory effect generated in the power amplifier increases as a change of the previous data average power value of the signal amplified by the power amplifier increases. Therefore, it is recognized that the narrow-band signal having the change portion 602a or 602b is more easily influenced by the thermal memory effect in comparison with the wide-band signal having no change portion.

In this regard, according to the present embodiment, if the bandwidth of the transmission signal is smaller than a predetermined threshold value, the PD processing is performed using the distortion compensation coefficient corresponding to a combination of the first address based on the current signal and the second address based on the previous signal in order to reduce the influence of the thermal memory effect. Meanwhile, it is anticipated that the influence of the thermal memory effect is relatively small when the bandwidth of the transmission signal is equal to or greater than a predetermined threshold value. Therefore, generation of the second address based on the previous signal is aborted, and the PD processing is performed only using the distortion compensation coefficient corresponding to the first address based on the current signal.

Figure 6:
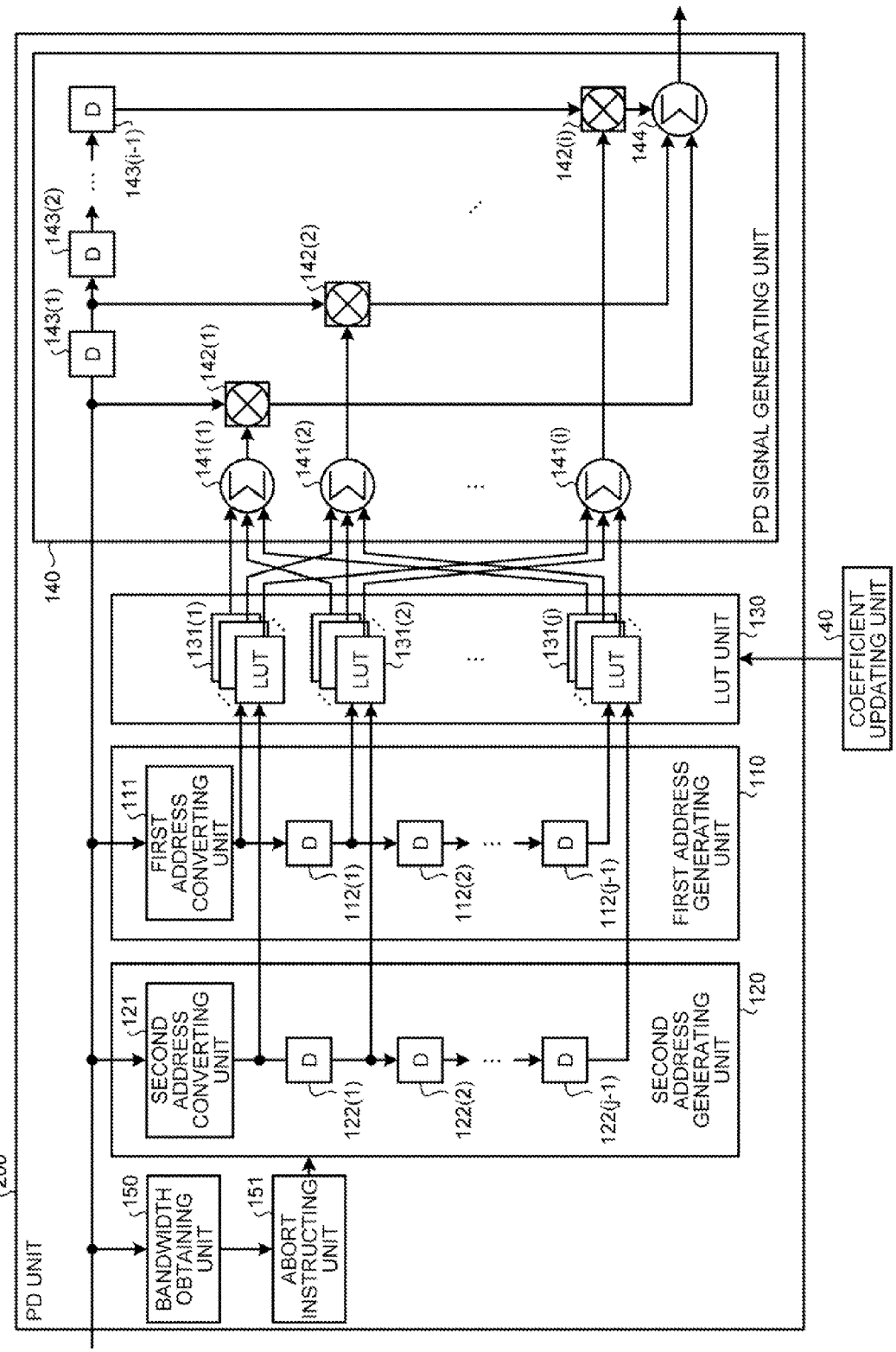
FIG. 6 is a diagram illustrating the configuration of a PD unit according to a second embodiment in detail.

Next, a configuration of the PD unit according to the present embodiment will be described in detail with reference to FIG. 6. FIG. 6 is a diagram illustrating a configuration of the PD unit according to the second embodiment in detail. Similar to the first embodiment, a block diagram of the transmitter according to the present embodiment is illustrated in FIG. 1. In the present embodiment, same reference numerals denote same elements as in the first embodiment, and it is assumed that they have functions similar to those of the first embodiment unless specified otherwise.

As illustrated in FIG. 6, a PD unit 200 according to the present embodiment further includes a bandwidth obtaining unit 150 and an abort instructing unit 151.

The bandwidth obtaining unit 150 obtains the bandwidth of the transmission signal input from the transmission signal generating unit 10. For example, the bandwidth obtaining unit 150 performs a fast Fourier transform for the transmission signal input from the transmission signal generating unit 10 to transform a time-domain signal to a frequency-domain signal and detects a gap between the lowest frequency and the highest frequency of a spectrum as a bandwidth. For example, the bandwidth obtaining unit 150 obtains the bandwidth of the transmission signal predetermined in a communication standard such as long-term evolution (LTE) from an upper layer. In addition, the bandwidth obtaining unit 150 outputs the obtained information on the bandwidth of the transmission signal to the abort instructing unit 151.

The abort instructing unit 151 determines whether or not the bandwidth of the transmission signal input from the bandwidth obtaining unit 150 is equal to or greater than a predetermined threshold value. The predetermined threshold value is set in advance such that a level of influence of the thermal memory effect measured through simulation or the like is ranged not to generate a distortion of the power amplifier 20. In addition, the abort instructing unit 151 instructs the second address generating unit 120 to proceed to generate the second address if the bandwidth of the transmission signal is smaller than a predetermined threshold value. Meanwhile, the abort instructing unit 151 instructs the second address generating unit 120 to abort generation of the second address if the bandwidth of the transmission signal is equal to or greater than a predetermined threshold value.

In addition, if generation of the second address is aborted by the second address generating unit 120, the PD signal generating unit 140 obtains the distortion compensation coefficient corresponding to the first address from each LUT of the LUT unit 130 and performs the PD processing using the obtained distortion compensation coefficient.

Figure 7:
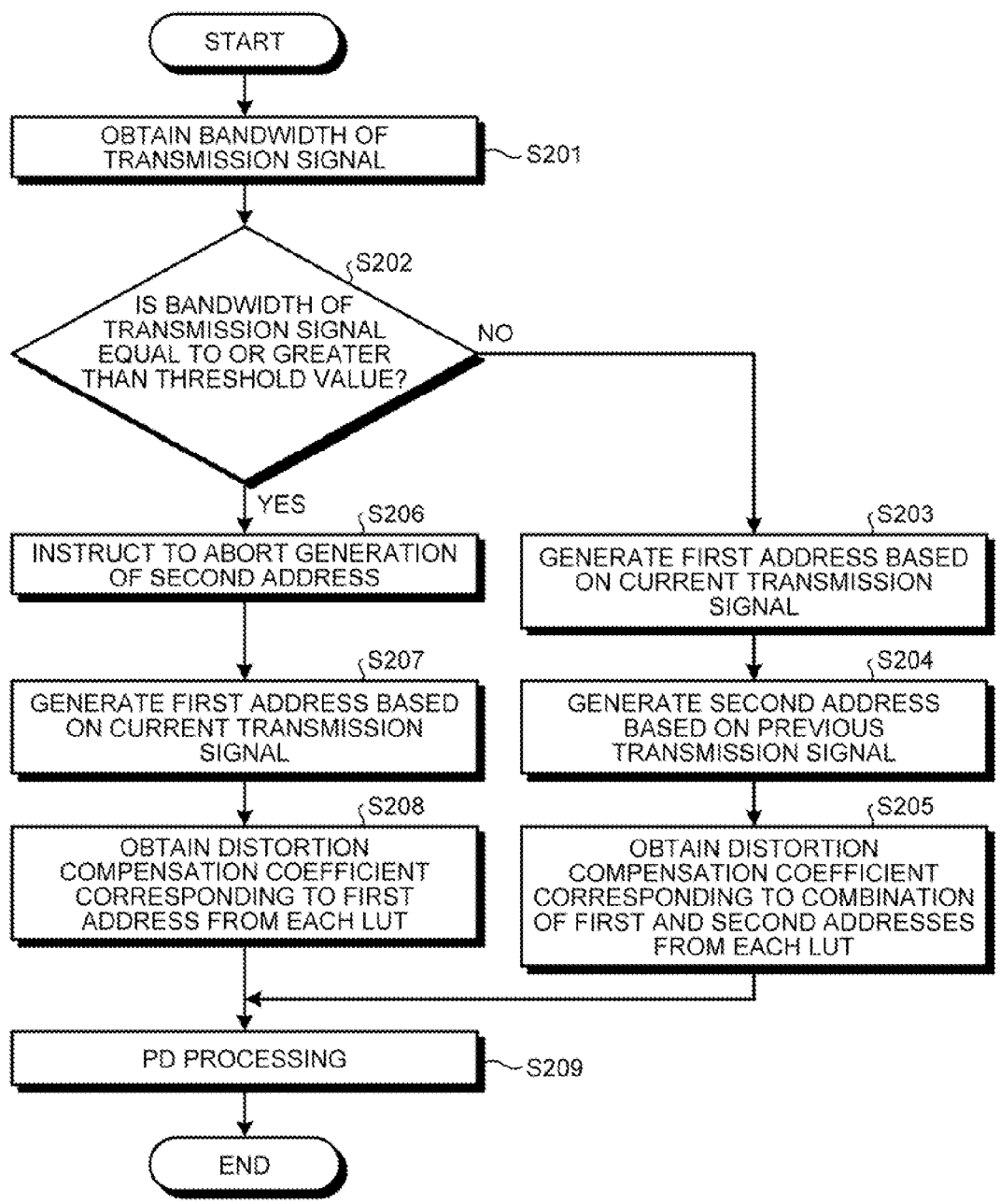
FIG. 7 is a flowchart illustrating a processing sequence of the distortion compensation processing using the transmitter according to the second embodiment.

Next, a processing sequence of the distortion compensation processing using the transmitter according to the present embodiment will be described with reference to FIG. 7. FIG. 7 is a flowchart illustrating a processing sequence of the distortion compensation processing using the transmitter according to the second embodiment.

As illustrated in FIG. 7, the bandwidth obtaining unit 150 of the PD unit 200 obtains the bandwidth of the transmission signal input from the transmission signal generating unit 10 (step S201). In addition, the abort instructing unit 151 determines whether or not the bandwidth of the transmission signal is equal to or greater than a predetermined threshold value (step S202).

The abort instructing unit 151 instructs the second address generating unit 120 to continue generating the second address if the bandwidth of the transmission signal is smaller than a predetermined threshold value (NO in step S202). In addition, the first address generating unit 110 generates the first address based on the current transmission signal input from the transmission signal generating unit 10 (step S203), and the second address generating unit 120 generates the second address based on the previous transmission signal (step S204). In addition, the PD signal generating unit 140 obtains the distortion compensation coefficient corresponding to a combination of the first and second addresses from each LUT of the (j) LUT groups 131(1) to 131(j) (step S205).

Meanwhile, the abort instructing unit 151 instructs the second address generating unit 120 to abort generation of the second address (step S206) if the bandwidth of the transmission signal is equal to or greater than a predetermined threshold value (YES in step S202). In addition, the first address generating unit 110 generates the first address based on the current transmission signal input from the transmission signal generating unit 10 (step S207). In addition, the PD signal generating unit 140 obtains the distortion compensation coefficient corresponding to the first address from each LUT of the (j) LUT groups 131(1) to 131(j) (step S208).

Then, the PD signal generating unit 140 performs the PD processing for the transmission signal x(t) input to the power amplifier 20 using the distortion compensation coefficient input from the LUT unit 130 to generate the PD signal PD(t) (step S209). That is, the PD signal generating unit 140 performs the PD processing using the distortion compensation coefficient corresponding to the first and second addresses when the process continues generating the second address using the second address generating unit 120 (NO in step S202, steps S203 to S205). Meanwhile, the PD signal generating unit 140 performs the PD processing using the distortion compensation coefficient corresponding to the first address when generation of the second address using the second address generating unit 120 is aborted (YES in step S202, steps S206 to S208).

As described above, the transmitter according to the present embodiment aborts generation of the second address and performs the PD processing only using the distortion compensation coefficient corresponding to the first address when the bandwidth of the transmission signal is equal to or greater than a predetermined threshold value. For this reason, it is possible to perform the PD processing only using the distortion compensation coefficient corresponding to the first address based on the current signal when the wide-band signal that is hardly influenced by the thermal memory effect is amplified and transmitted. Therefore, it is possible to save power consumption caused by the PD processing as the previous signal is not used.

[c] Third Embodiment

The third embodiment is different from the first embodiment in that the number of the generated second addresses is restricted when the bandwidth of the transmission signal is equal to or greater than a predetermined threshold value. In this regard, hereinafter, description will be mainly made for an example in which generation of the second address is aborted when the bandwidth of the transmission signal is equal to or greater than a predetermined threshold value.

As described in the second embodiment, the narrow-band signal is more easily influenced by the thermal memory effect than the wide-band signal. In this regard, according to the present embodiment, the PD processing is performed using the distortion compensation coefficient corresponding to a combination of the first address based on the current signal and the second address based on the previous signal in order to reduce influence of the thermal memory effect when the bandwidth of the transmission signal is smaller than a predetermined threshold value. Meanwhile, when the bandwidth of the transmission signal is equal to or greater than a predetermined threshold value, the influence of the thermal memory effect is relatively small. Therefore, the number of the generated second addresses based on the previous signal is restricted, and the PD processing is performed using the distortion compensation coefficient corresponding to a combination of the first address and the restricted second address.

Figure 8:
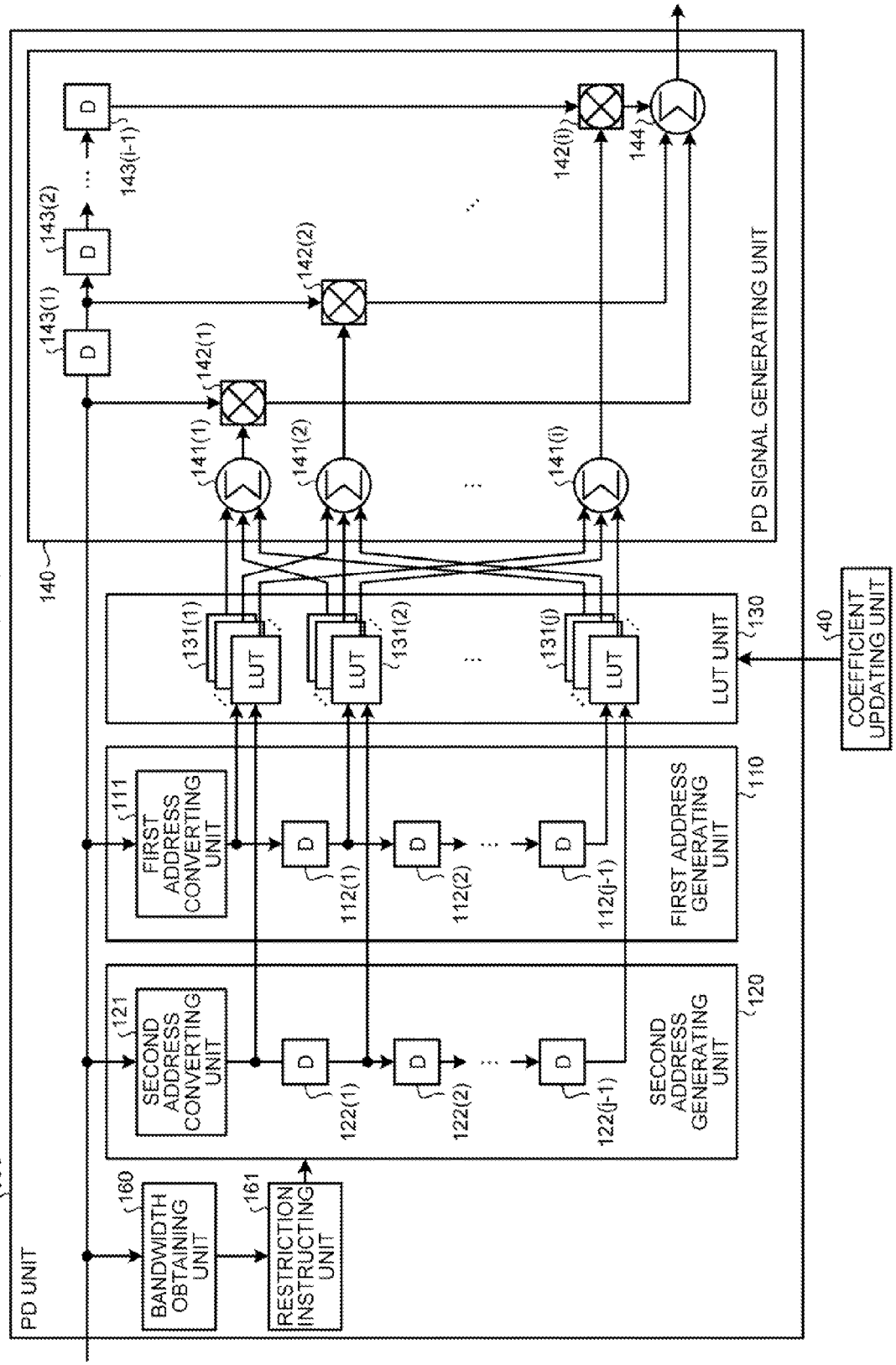
FIG. 8 is a diagram illustrating the configuration of a PD unit according to a third embodiment in detail.

FIG. 8 is a diagram illustrating a configuration of the PD unit according to the third embodiment in detail. Similar to the first embodiment, a block diagram of the transmitter according to the present embodiment is illustrated in FIG. 1. In the present embodiment, same reference numerals denote same elements as in the first embodiment, and it is assumed that they have functions similar to those of the first embodiment unless specified otherwise.

As illustrated in FIG. 8, a PD unit 300 according to the present embodiment further includes a bandwidth obtaining unit 160 and a restriction instructing unit 161.

The bandwidth obtaining unit 160 obtains the bandwidth of the transmission signal input from the transmission signal generating unit 10. For example, the bandwidth obtaining unit 160 performs a fast Fourier transform on the transmission signal input from the transmission signal generating unit 10 to transform a time-domain signal into a frequency-domain signal and detects a gap between the lowest frequency and the highest frequency of a spectrum as a bandwidth. For example, the bandwidth obtaining unit 160 obtains the bandwidth of the transmission signal predetermined in a communication standard such as LTE from an upper layer. In addition, the bandwidth obtaining unit 160 outputs the obtained information on the bandwidth of the transmission signal to the restriction instructing unit 161.

The restriction instructing unit 161 determines whether or not the bandwidth of the transmission signal input from the bandwidth obtaining unit 160 is equal to or greater than a predetermined threshold value. In addition, the predetermined threshold value is set in advance such that a level of influence of the thermal memory effect measured through simulation or the like is ranged not to generate a distortion of the power amplifier 20. In addition, the restriction instructing unit 161 instructs the second address generating unit 120 to continue generating the second address when the bandwidth of the transmission signal is smaller than a predetermined threshold value. Meanwhile, the restriction instructing unit 161 instructs the second address generating unit 120 to restrict the number of the generated second addresses when the bandwidth of the transmission signal is equal to or greater than a predetermined threshold value.

In addition, when the number of second addresses generated by the second address generating unit 120 is restricted, the PD signal generating unit 140 obtains the distortion compensation coefficient corresponding to the first address and the number-restricted second address from each LUT of the LUT unit 130 and performs the PD processing.

Figure 9:
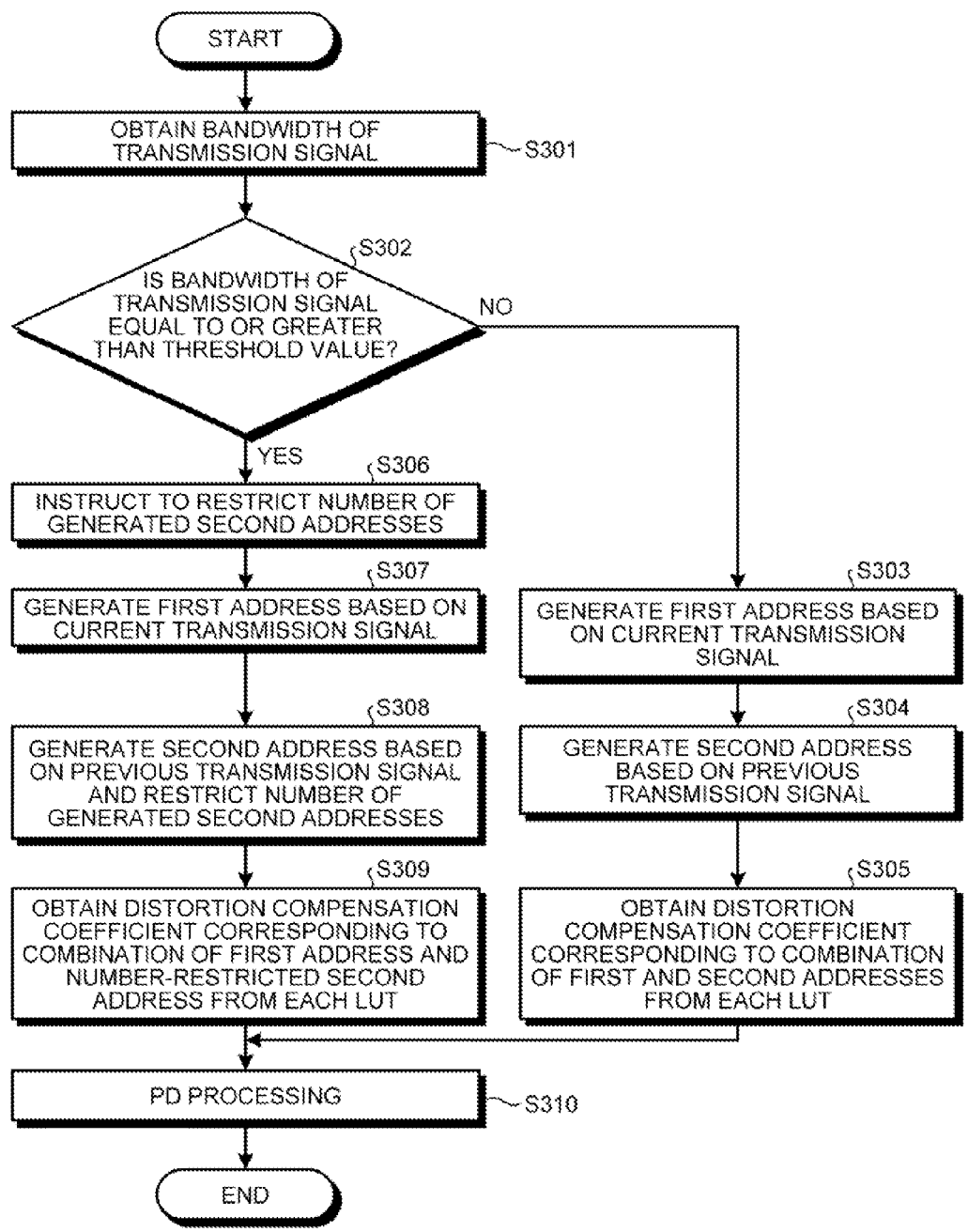
FIG. 9 is a flowchart illustrating a processing sequence of the distortion compensation processing using the transmitter according to the third embodiment.

Next, a processing sequence of the distortion compensation processing using the transmitter according to the present embodiment will be described with reference to FIG. 9. FIG. 9 is a flowchart illustrating a processing sequence of the distortion compensation processing using the transmitter according to the third embodiment.

As illustrated in FIG. 9, the bandwidth obtaining unit 160 of the PD unit 300 obtains the bandwidth of the transmission signal input from the transmission signal generating unit 10 (step S301). In addition, the restriction instructing unit 161 determines whether or not the bandwidth of the transmission signal is equal to or greater than a predetermined threshold value (step S302).

The restriction instructing unit 161 instructs the second address generating unit 120 to continue generating the second address when the bandwidth of the transmission signal is smaller than a predetermined threshold value (NO in step S302). In addition, the first address generating unit 110 generates the first address based on the current transmission signal input from the transmission signal generating unit 10 (step S303), and the second address generating unit 120 generates the second address based on the previous transmission signal (step S304). In addition, the PD signal generating unit 140 obtains the distortion compensation coefficient corresponding to a combination of the first and second addresses from each LUT of the j LUT groups 131(1) to 131(j) (step S305).

Meanwhile, when the bandwidth of the transmission signal is equal to or greater than a predetermined threshold value (YES in step S302), the restriction instructing unit 161 instructs the second address generating unit 120 to restrict the number of the generated second addresses (step S306). In addition, the first address generating unit 110 generates the first address based on the current transmission signal input from the transmission signal generating unit 10 (step S307). In addition, the second address generating unit 120 generates the second address based on the previous transmission signal and restricts the number of the generated second addresses (step S308). For example, assuming that the second address generating unit 120 generates 10 second addresses, the second address generating unit 120 restricts the number of the second addresses by unifying the 1st to 5th second addresses into the 1st second address and unifying the 6th to 10th second addresses into the 6th second address. In addition, the PD signal generating unit 140 obtains the distortion compensation coefficient corresponding to a combination of the first address and the number-restricted second address from each LUT of the j LUT groups 131(1) to 131(j) (step S309).

Then, the PD signal generating unit 140 performs the PD processing for the transmission signal x(t) input to the power amplifier 20 using the distortion compensation coefficient input from the LUT unit 130 to generate the PD signal PD(t) (step S310). That is, the PD signal generating unit 140 performs the PD processing using the distortion compensation coefficient corresponding to the first and second addresses when the second address generating unit 120 continues generating the second address (NO in step S302, steps S303 to S305). Meanwhile, the PD signal generating unit 140 performs the PD processing using the distortion compensation coefficient corresponding to a combination of the first address and the number-restricted second address when the number of second addresses generated by the second address generating unit 120 is restricted (YES in step S302, steps S306 to S309).

As described above, when the bandwidth of the transmission signal is equal to or greater than a predetermined threshold value, the transmitter according to the present embodiment restricts the number of the generated second addresses and performs the PD processing using the distortion compensation coefficient corresponding to a combination of the first address and the number-restricted second address. For this reason, when the wide-band signal, which is hardly influenced by the thermal memory effect, is amplified and transmitted, it is possible to save power consumption caused by the PD processing by the number of the second addresses being restricted based on the previous signal.

[d] Fourth Embodiment

The fourth embodiment is different from the first embodiment in that the distortion compensation coefficient corresponding to a combination of the first and second addresses is obtained from a part of LUTs out of a plurality of LUTs. In this regard, hereinafter, description will be mainly made for an example in which the distortion compensation coefficient corresponding to a combination of the first and second addresses is obtained from a part of LUTs out of a plurality of LUTs.

Figure 10:
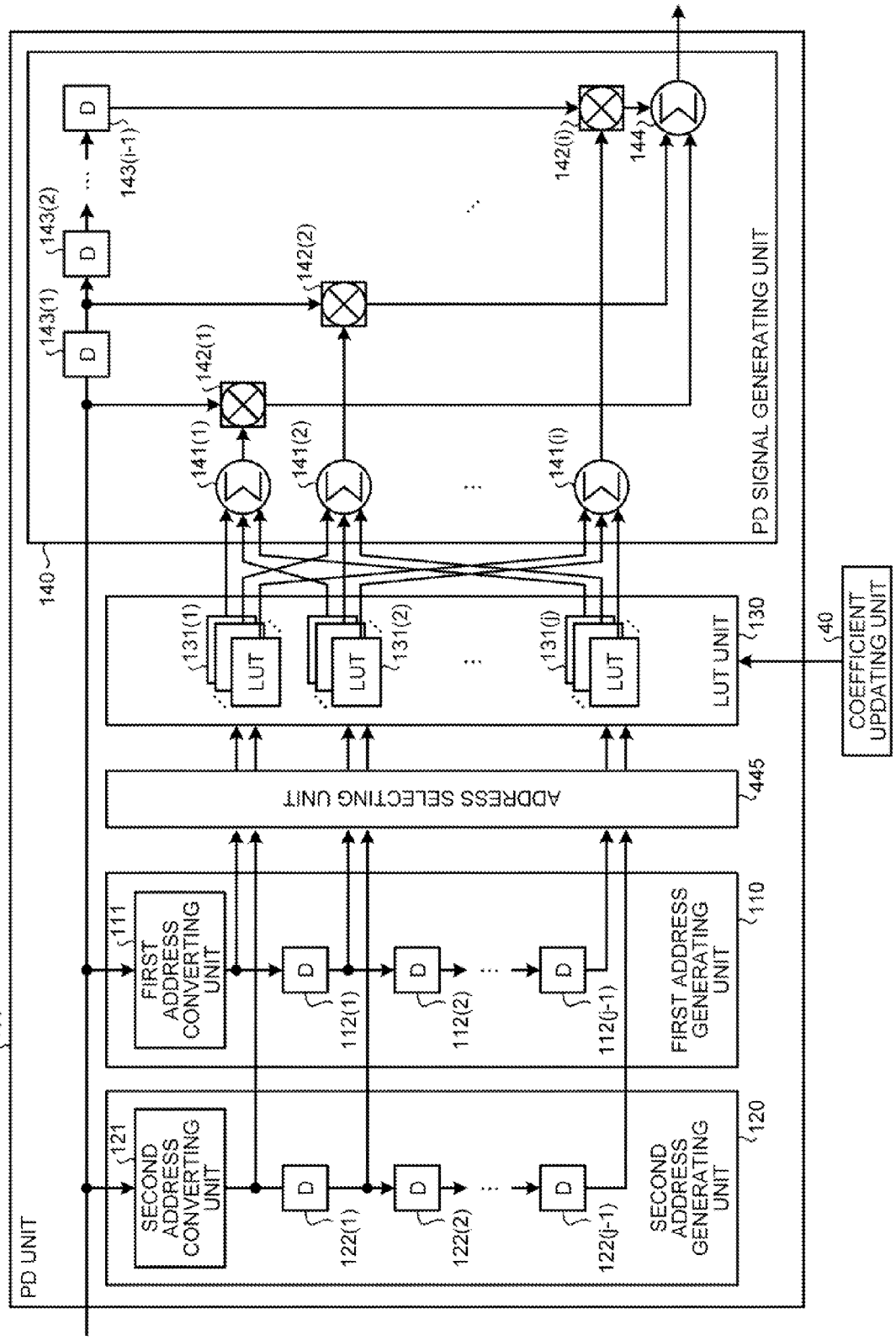
FIG. 10 is a diagram illustrating the configuration of a PD unit according to a fourth embodiment in detail.

FIG. 10 is a diagram illustrating a configuration of the PD unit according to the fourth embodiment in detail. Similar to the first embodiment, a block diagram of the transmitter according to the present embodiment is illustrated in FIG. 1. In the present embodiment, same reference numerals denote same elements as in the first embodiment, and it is assumed that they have functions similar to those of the first embodiment unless specified otherwise.

As illustrated in FIG. 10, a PD unit 400 according to the present embodiment further includes an address selecting unit 445.

The address selecting unit 445 selects at least one of the first and second addresses. For example, the address selecting unit 445 selects both the first and second addresses. For example, the address selecting unit 445 selects only the first address.

The PD signal generating unit 140 obtains the distortion compensation coefficient corresponding to a combination of the first and second addresses from a part of LUTs out of overall LUTs included in the j LUT groups 131(1) to 131(j) when the address selecting unit 445 selects both the first and second addresses. In addition, the PD signal generating unit 140 obtains the distortion compensation coefficient corresponding to the first address from the remaining LUTs out of the overall LUTs included in the j LUT groups 131(1) to 131(j) when the address selecting unit 445 selects the first address.

Figure 11:
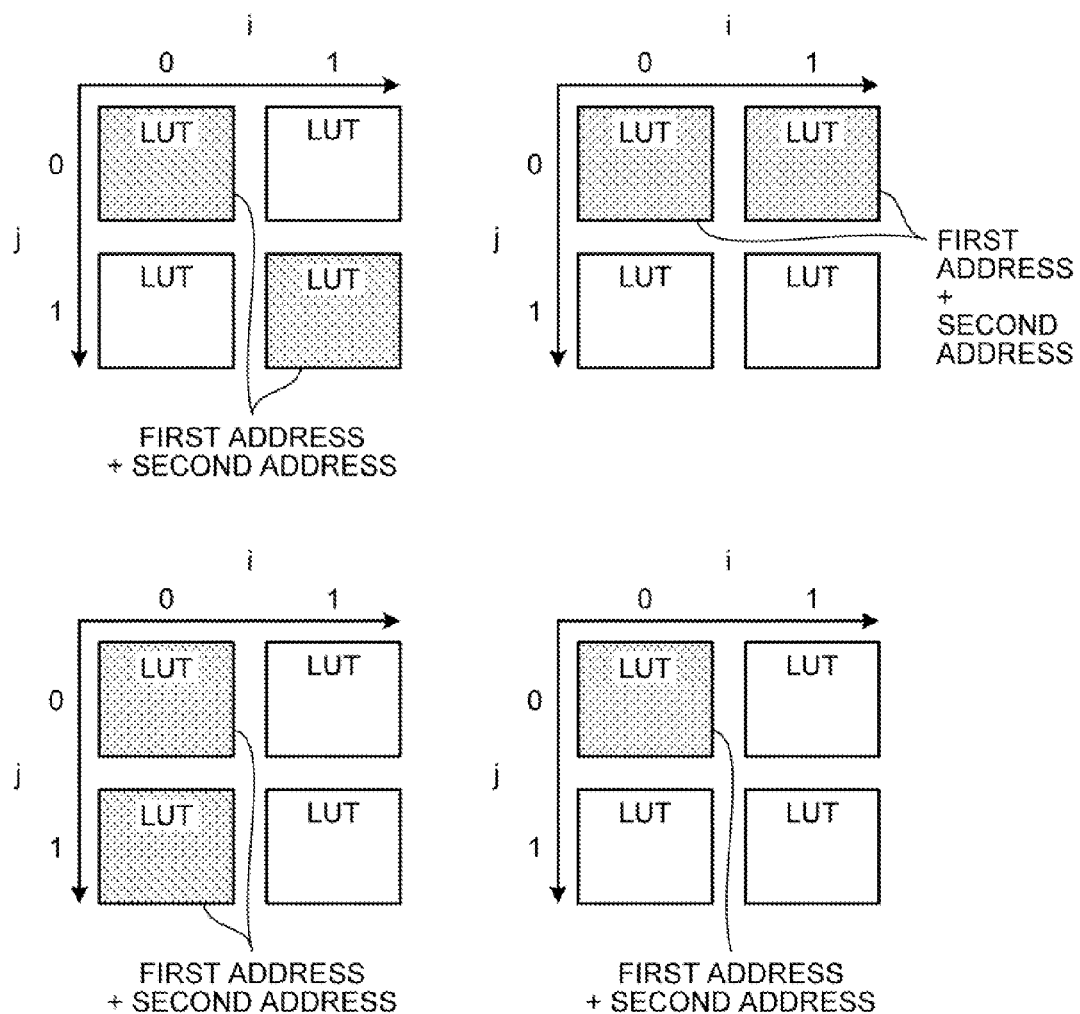
FIG. 11 is a diagram illustrating a specific example of the processing in the address selecting unit according to the fourth embodiment.

Here, a specific example of the processing in the address selecting unit 445 will be described with reference to FIG. 11. FIG. 11 is a diagram illustrating a specific example of the processing in the address selecting unit 445 according to the fourth embodiment. In the example of FIG. 11, it is assumed that each of two LUT groups 131(1) and 131(2) has two LUTs.

As illustrated in FIG. 11, two LUT groups 131(1) and 131(2) include the total of four LUTs ($LUT_{i,j}$ (where, i=0, 1, and j=0, 1), i.e., $LUT_{0,0}$, $LUT_{1,0}$, $LUT_0$,) and $LUT_{1,1}$). In this case, the address selecting unit 445 selects both the first and second addresses as illustrated in the upper left side of FIG. 11. Then, the PD signal generating unit 140 obtains the distortion compensation coefficient corresponding to a combination of the first and second addresses from two LUTs i.e., $LUT_{0,0}$ and $LUT_{1,1}$ out of the total of four LUTs. In addition, the address selecting unit 445 selects the first address out of the first and second addresses. Then, the PD signal generating unit 140 obtains the distortion compensation coefficient corresponding to the first address from the remaining two LUTs i.e., $LUT_{1,0}$ and $LUT_{0,1}$.

In addition, the PD signal generating unit 140 may appropriately change the LUT for obtaining the distortion compensation coefficient corresponding to a combination of the first and second addresses and the LUT for obtaining the distortion compensation coefficient corresponding to the first address. For example, the PD signal generating unit 140 obtains the distortion compensation coefficient corresponding to a combination of the first and second addresses from two LUTs ($LUT_{0,0}$ and $LUT_{0,1}$) out of a total of four LUTs as illustrated in the lower left side of FIG. 11. In addition, the PD signal generating unit 140 obtains the distortion compensation coefficient corresponding to the first address from the remaining two LUTs ($LUT_{1,0}$ and $LUT_{1,1}$).

For example, the PD signal generating unit 140 obtains the distortion compensation coefficient corresponding to a combination of the first and second addresses from two LUTs ($LUT_{0,0}$ and $LUT_{1,0}$) out of a total of four LUTs as illustrated in the upper right side of FIG. 11. In addition, the PD signal generating unit 140 obtains the distortion compensation coefficient corresponding to the first address from the remaining two LUTs ($LUT_{0,1}$ and $LUT_{1,1}$).

For example, the PD signal generating unit 140 obtains the distortion compensation coefficient corresponding to a combination of the first and second addresses from a single LUT ($LUT_{0,0}$) out of a total of four LUTs as illustrated in the lower right side of FIG. 11. In addition, the PD signal generating unit 140 obtains the distortion compensation coefficient corresponding to the first address from the remaining three LUTs ($LUT_{1,0}$, $LUT_{0,1}$, and $LUT_{1,1}$).

Figure 12:
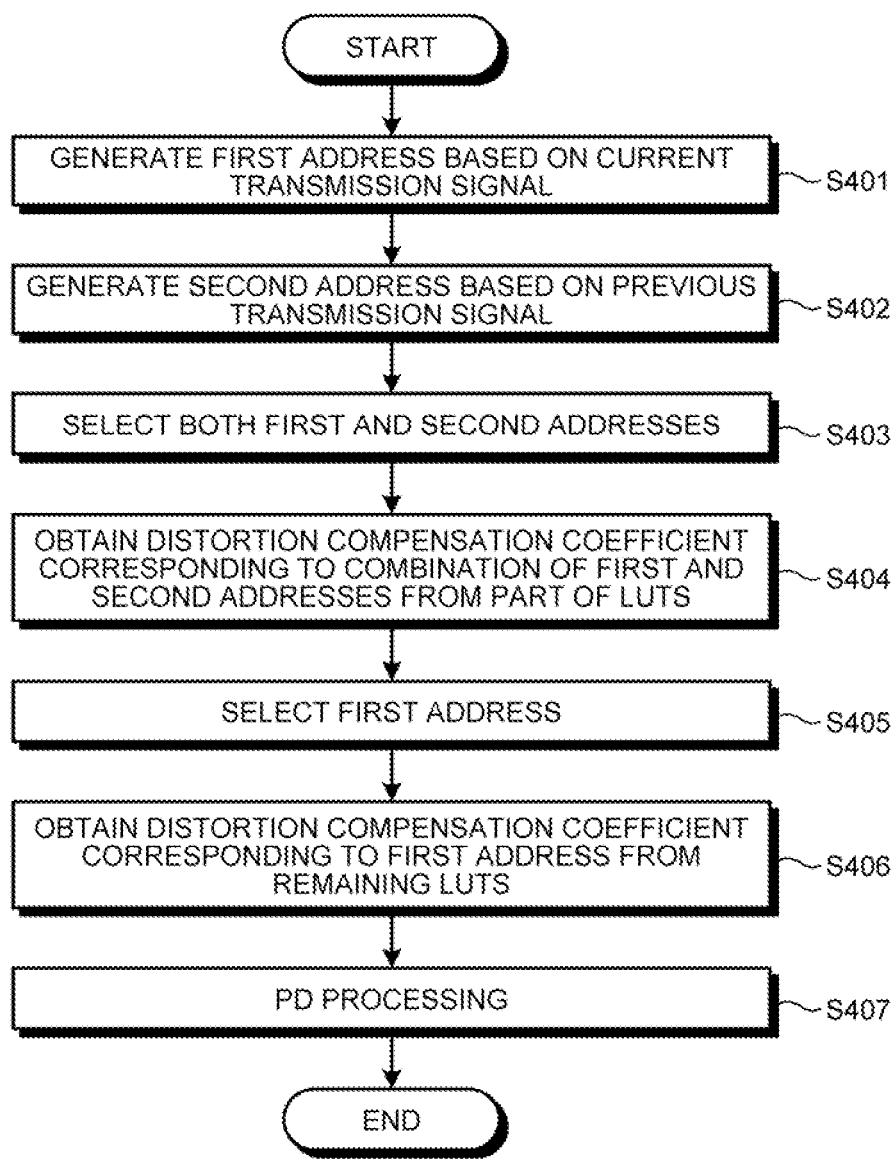
FIG. 12 is a flowchart illustrating a processing sequence of the distortion compensation processing using the transmitter according to the fourth embodiment.

Next, a processing sequence of the distortion compensation processing using the transmitter according to the present embodiment will be described with reference to FIG. 12. FIG. 12 is a flowchart illustrating a processing sequence of the distortion compensation coefficient using the transmitter according to the fourth embodiment.

As illustrated in FIG. 12, the first address generating unit 110 of the PD unit 400 generates the first address based on the current transmission signal input from the transmission signal generating unit 10 (step S401). In addition, the second address generating unit 120 generates the second address based on the previous transmission signal (step S402).

In addition, the address selecting unit 445 selects both the first and second addresses (step S403). In this case, the PD signal generating unit 140 obtains the distortion compensation coefficient corresponding to a combination of the first and second addresses from a part of LUTs out of the overall LUTs included in the (j) LUT groups 131(1) to 131(j) (step S40).

In addition, the address selecting unit 445 selects the first address (step S405). In this case, the PD signal generating unit 140 obtains the distortion compensation coefficient corresponding to the first address from the remaining LUTs out of the overall LUTs included in the (j) LUT groups 131(1) to 131(j) (step S406). In addition, the PD signal generating unit 140 performs the PD processing for the transmission signal x(t) input to the power amplifier 20 using the obtained distortion compensation coefficient to generate the PD signal PD(t) (step S407).

As described above, the transmitter according to the present embodiment obtains the distortion compensation coefficient corresponding to a combination of the first address based on the current transmission signal and the second address based on the previous transmission signal from a part of LUTs out of a plurality of LUTs. In addition, the transmitter according to the present embodiment obtains the distortion compensation coefficient corresponding to the first address from the remaining LUTs out of a plurality of LUTs. For this reason, using the transmitter according to the present embodiment, it is possible to save power consumption necessary in the PD processing as two addresses are not used for the remaining LUTs.

[e] Fifth Embodiment

The fifth embodiment is different from the first embodiment in that whether or not the distortion compensation coefficient corresponding to a combination of the first and second addresses is obtained from each LUT or whether or not the distortion compensation coefficient corresponding to the first address is obtained from each LUT is determined based on the comparison result between the first address and a threshold value. In this regard, hereinafter, description will be mainly made for an example in which whether or not the distortion compensation coefficient corresponding to a combination of the first and second addresses is obtained from each LUT or whether or not the distortion compensation coefficient corresponding to the first address is obtained from each LUT is determined based on the comparison result between the first address and the threshold value.

Figure 13:
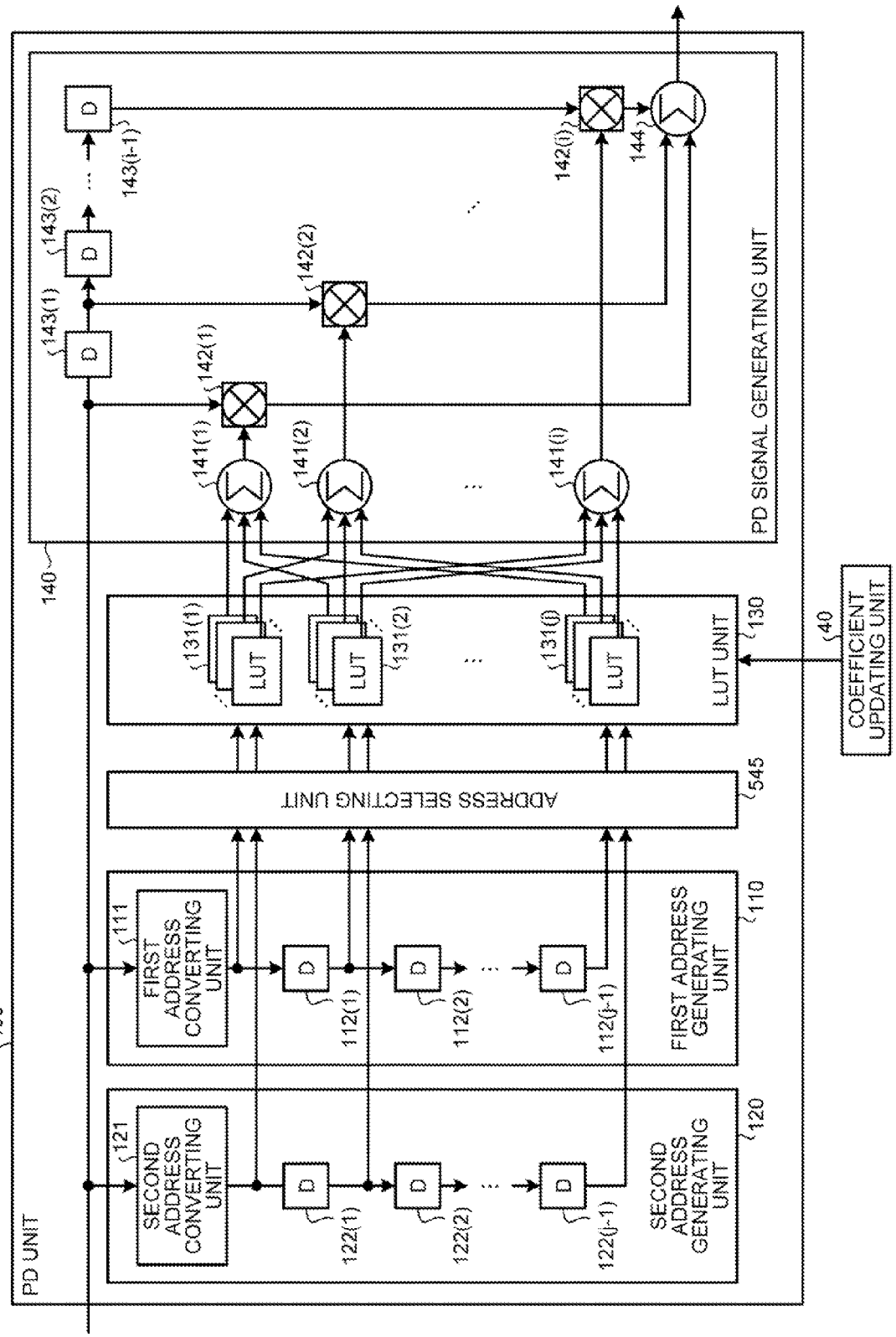
FIG. 13 is a diagram illustrating the configuration of a PD unit according to a fifth embodiment in detail.

FIG. 13 is a diagram illustrating a configuration of the PD unit according to the fifth embodiment in detail. Similar to the first embodiment, a block diagram of the transmitter according to the present embodiment is illustrated in FIG. 1. In the present embodiment, same reference numerals denote same elements as in the first embodiment, and it is assumed that they have functions similar to those of the first embodiment unless specified otherwise.

As illustrated in FIG. 13, a PD unit 500 according to the present embodiment further includes an address selecting unit 545.

The address selecting unit 545 compares the first address with a predetermined threshold value. The address selecting unit 545 selects at least one of the first and second addresses depending on the comparison result. For example, the address selecting unit 545 selects both the first and second addresses if the first address is equal to or greater than the threshold value. Meanwhile, the address selecting unit 545 selects only the first address if the first address is smaller than the threshold value.

The PD signal generating unit 140 obtains the distortion compensation coefficient corresponding to a combination of the first and second addresses from each LUT of the LUT groups 131(1) to 131(j) if both the first and second addresses are selected by the address selecting unit 545. Meanwhile, the PD signal generating unit 140 obtains the distortion compensation coefficient corresponding to the first address from each LUT if the first address is selected by the address selecting unit 545.

Figure 14:
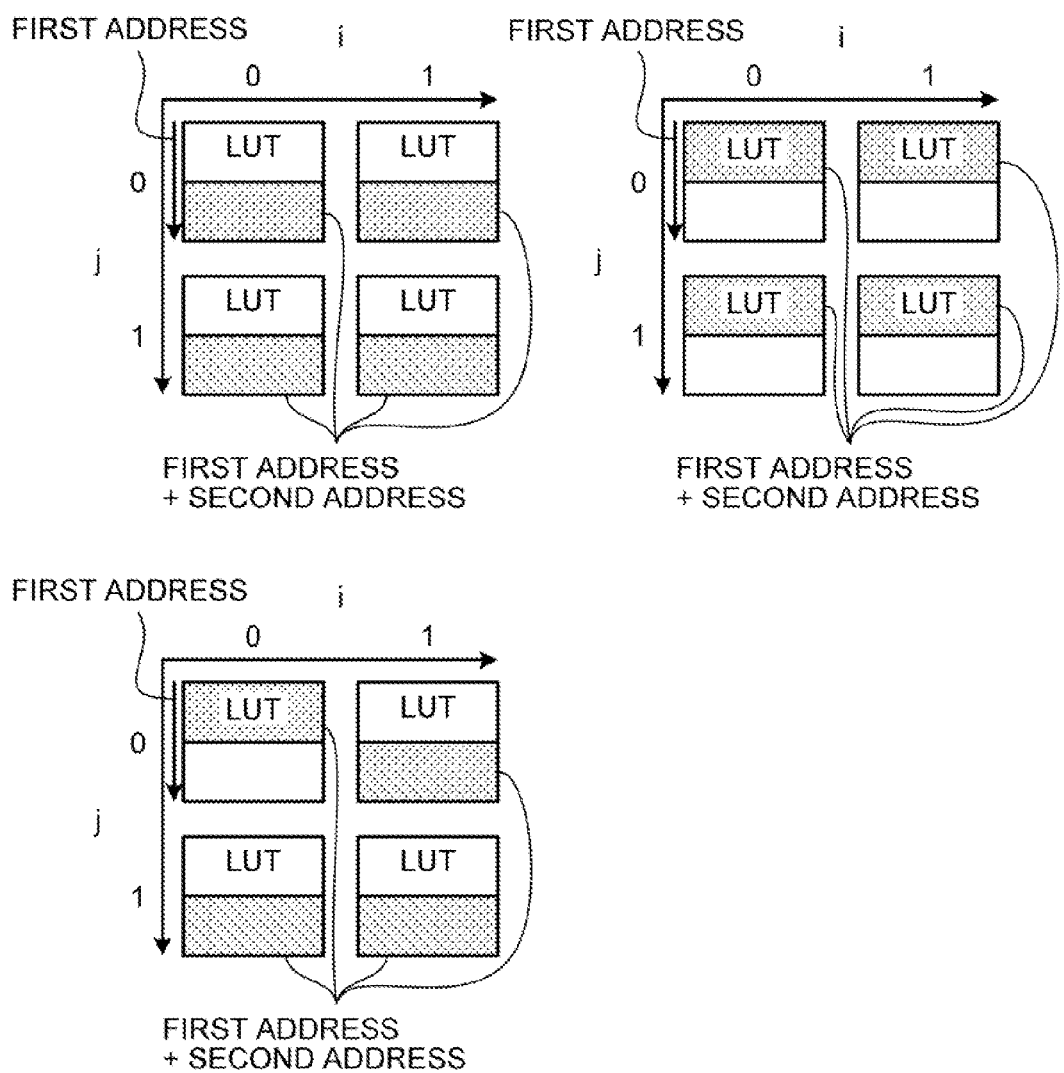
FIG. 14 is a diagram illustrating a specific example of the processing in the address selecting unit according to the fifth embodiment.

Here, a specific example of the processing in the address selecting unit 545 will be described with reference to FIG. 14. FIG. 14 is a diagram illustrating a specific example of the processing in the address selecting unit 545 according to the fifth embodiment. In the example of FIG. 14, it is assumed that each of two LUT groups 131(1) and 131(2) has two LUTs.

As illustrated in FIG. 14, two LUT groups 131(1) and 131(2) include a total of four LUTs ($LUT_{i,j}$ (where, i=0, 1, and j=0, 1), that is, $LUT_{0,0}$, $LUT_{1,0}$, $LUT_{0,1}$ and $LUT_{1,1}$). In this case, the address selecting unit 545 compares the first address of each $LUT_{i,j}$ with a threshold value and selects both the first and second addresses if the first address is equal to or greater than the threshold value as illustrated in the upper left side of FIG. 14. Then, the PD signal generating unit 140 obtains the distortion compensation coefficient corresponding to a combination of the first and second addresses from each $LUT_{i,j}$. Meanwhile, the address selecting unit 545 selects the first address if the first address is smaller than the threshold value. Then, the PD signal generating unit 140 obtains the distortion compensation coefficient corresponding to the first address from each $LUT_{i,j}$.

In addition, the address selecting unit 545 and the PD signal generating unit 140 may appropriately change details of the processing depending on the comparison result between the first address and the threshold value. For example, the address selecting unit 545 compares the first address of each $LUT_{i,j}$ with the threshold value and selects both the first and second addresses if the first address is smaller than the threshold value as illustrated in the upper right side of FIG. 14. In addition, the PD signal generating unit 140 obtains the distortion compensation coefficient corresponding to a combination of the first and second addresses from each $LUT_{i,j}$. Meanwhile, the address selecting unit 545 selects the first address if the first address is equal to or greater than the threshold value. In addition, the PD signal generating unit 140 obtains the distortion compensation coefficient corresponding to the first address from each $LUT_{i,j}$.

For example, the address selecting unit 545 compares the first address of the $LUT_{0,0}$ with a threshold value and selects both the first and second addresses if the first address is smaller than the threshold value as illustrated in the lower left side of FIG. 14. In addition, the PD signal generating unit 140 obtains the distortion compensation coefficient corresponding to a combination of the first and second addresses from the $LUT_{0,0}$. Meanwhile, the address selecting unit 545 selects the first address if the first address of the $LUT_{0,0}$ is equal to or greater than the threshold value. In addition, the PD signal generating unit 140 obtains the distortion compensation coefficient corresponding to the first address from the $LUT_{0,0}$. Furthermore, the address selecting unit 545 compares the first address of each of $LUT_{1,0}$, $LUT_{0,1}$, and $LUT_{1,1}$ with a threshold value. In addition, the address selecting unit 545 selects both the first and second addresses if the first address is equal to or greater than the threshold value. In addition, the PD signal generating unit 140 obtains the distortion compensation coefficient corresponding to a combination of the first and second addresses from each of $LUT_{1,0}$, $LUT_{0,1}$, and $LUT_{1,1}$. Meanwhile, the address selecting unit 545 selects the first address if the first address is smaller than a threshold value. In addition, the PD signal generating unit 140 obtains the distortion compensation coefficient corresponding to the first address from each of $LUT_{1,0}$, $LUT_{0,1}$, and $LUT_{1,1}$.

Figure 15:
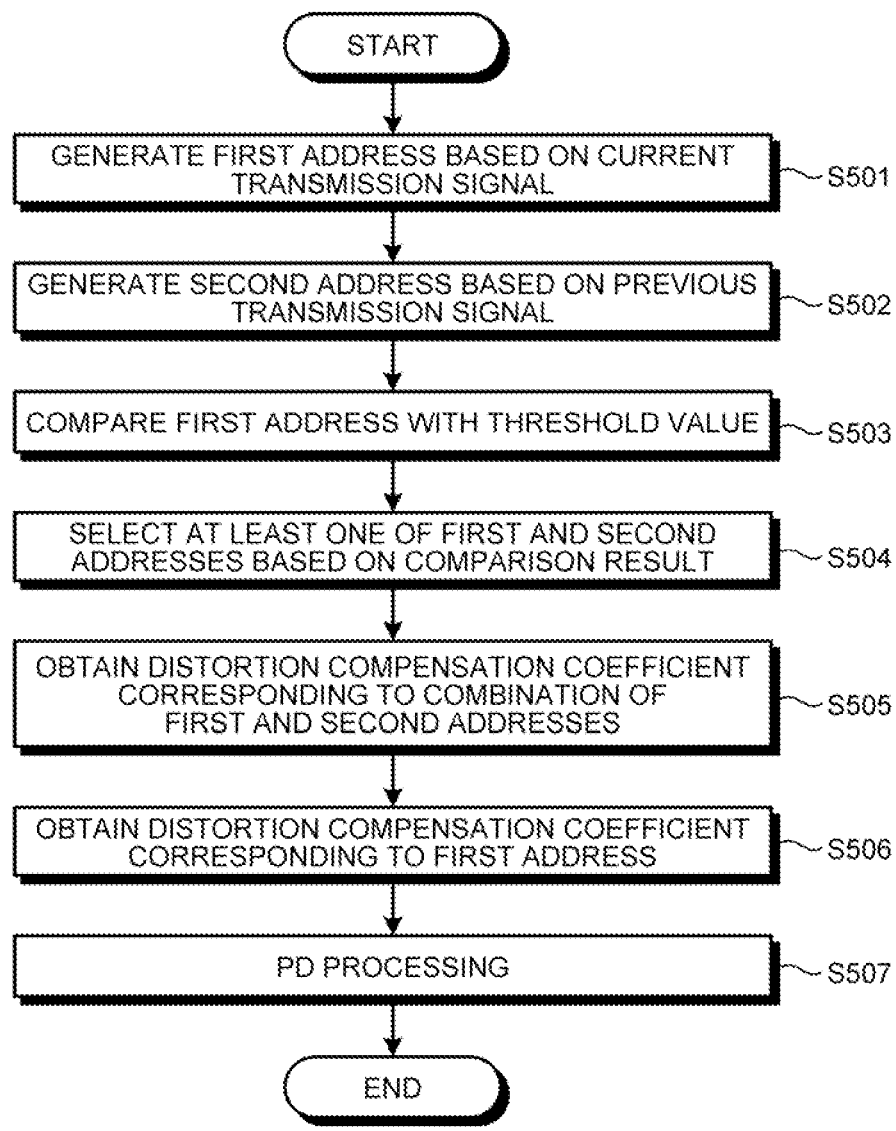
FIG. 15 is a flowchart illustrating a processing sequence of the distortion compensation processing using the transmitter according to the fifth embodiment.

Next, a processing sequence of the distortion compensation processing using the transmitter according to the present embodiment will be described with reference to FIG. 15. FIG. 15 is a flowchart illustrating a processing sequence of the distortion compensation processing using the transmitter according to the fifth embodiment.

As illustrated in FIG. 15, the first address generating unit 110 of the PD unit 500 generates the first address based on the current transmission signal input from the transmission signal generating unit 10 (step S501). In addition, the second address generating unit 120 generates the second address based on the previous transmission signal (step S502).

In addition, the address selecting unit 545 compares the first address with a predetermined threshold value (step S503). The address selecting unit 545 selects at least one of the first and second addresses depending on the comparison result (step S504). In addition, the PD signal generating unit 140 obtains the distortion compensation coefficient corresponding to a combination of the first and second addresses from each LUT of the LUT groups 131(1) to 131(j) if the address selecting unit 545 selects both the first and second addresses (step S505). Meanwhile, the PD signal generating unit 140 obtains the distortion compensation coefficient corresponding to the first address from each LUT if the address selecting unit 545 obtains the first address (step S506). In addition, the PD signal generating unit 140 performs the PD processing for the transmission signal t(x) input to the power amplifier 20 using the obtained distortion compensation coefficient to generate the PD signal PD(t) (step S507).

As described above, the transmitter according to the present embodiment compares the first address with a threshold value. In addition, the transmitter according to the present embodiment determines whether or not the distortion compensation coefficient corresponding to a combination of the first and second addresses is obtained from each LUT or whether or not the distortion compensation coefficient corresponding to the first address is obtained from each LUT based on the comparison result. For this reason, using the transmitter according to the present embodiment, it is possible to save power consumption necessary in the PD processing in comparison with a case where the distortion compensation coefficient is obtained from each LUT using a combination of two addresses regardless of whether the first address is larger or smaller.

In each of the aforementioned embodiments, description has been made for a configuration in which the simple moving average value or the weighted moving average value obtained by executing the simple moving average processing or the weighted moving average processing for the power value of the previous transmission signal is generated as the second address. However, each of the embodiments may be modified such that the simple moving average value or the weighted moving average value obtained by executing the simple moving average processing or the weighted moving average processing for the amplitude value of the previous transmission signal is generated as the second address.

Using the distortion compensation apparatus according to an aspect of the invention, it is possible to appropriately perform distortion compensation while suppressing an increase in a circuit scale.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A distortion compensation apparatus comprising:
   an amplifying unit that amplifies an input signal;
   a plurality of distortion compensation coefficient storage units that store distortion compensation coefficients for compensating for a distortion of the amplifying unit by being associated with two different addresses;
   a first address generating unit that generates a first address based on a current input signal which is the input signal to be currently input to the amplifying unit;
   a second address generating unit that generates a second address different from the first address based on a previous input signal which is the input signal to be previously input to the amplifying unit;
   a distortion compensating unit that obtains the distortion compensation coefficient corresponding to a combination of the first and second addresses from each of the distortion compensation coefficient storage units and performs a pre-distortion processing for the current input signal to be input to the amplifying unit using the obtained distortion compensation coefficient;
   a bandwidth obtaining unit that obtains a bandwidth of the current input signal; and
   an abort instructing unit that instructs the second address generating unit to abort generation of the second address in a case where the bandwidth of the current input signal is equal to or greater than a predetermined threshold value,
   wherein the distortion compensating unit obtains the distortion compensation coefficient corresponding to the first address from each of the distortion compensation coefficient storage units and performs the pre-distortion processing using the obtained distortion compensation coefficient in a case where the generation of the second address in the second address generating unit is aborted.

2. The distortion compensation apparatus according to claim 1,
   wherein the second address generating unit generates, as the second address, a simple moving average value obtained by executing a simple moving average processing for a power value of the previous input signal.

3. The distortion compensation apparatus according to claim 1,
   wherein the second address generating unit generates, as the second address, a simple moving average value obtained by executing a simple moving average processing for an amplitude value of the previous input signal.

4. The distortion compensation apparatus according to claim 1,
   wherein the second address generating unit generates, as the second address, a weighted moving average value obtained by executing a weighted moving average processing, in which a weight increases as time approaches to a timing of the current input signal, for an power value of the previous input signal.

5. The distortion compensation apparatus according to claim 1,
   wherein the second address generating unit generates, as the second address, a weighted moving average value obtained by executing a weighted moving average processing, in which a weight increases as time approaches to a timing of the current input signal, for an amplitude value of the previous input signal.

6. The distortion compensation apparatus according to claim 1, further comprising an address selecting unit that selects the first address or the second address or combination thereof,
   wherein the distortion compensating unit obtains the distortion compensation coefficient corresponding to a combination of the first and second addresses from a part of the distortion compensation coefficient storage units out of the plurality of the distortion compensation coefficient storage units in a case where the address selecting unit selects both the first and second addresses, and
   the distortion compensating unit obtains the distortion compensation coefficient corresponding to the first address from remaining distortion compensation coefficient storage units excluding the part of the distortion compensation coefficient storage units out of the plurality of the distortion compensation coefficient storage units in a case where the address selecting unit selects the first address.

7. The distortion compensation apparatus according to claim 1, further comprising an address selecting unit that compares the first address with a threshold value and selects the first address or the second address or combination thereof based on the comparison result,
   wherein the distortion compensating unit obtains the distortion compensation coefficient corresponding to a combination of the first and second addresses from each of the distortion compensation coefficient storage units in a case where the address selecting unit selects both the first and second addresses, and
   the distortion compensating unit obtains the distortion compensation coefficient corresponding to the first address from each of the distortion compensation coefficient storage units in a case where the address selecting unit selects the first address.

8. A distortion compensation apparatus comprising:
   an amplifying unit that amplifies an input signal;
   a plurality of distortion compensation coefficient storage units that store distortion compensation coefficients for compensating for a distortion of the amplifying unit by being associated with two different addresses;

a first address generating unit that generates a first address based on a current input signal which is the input signal to be currently input to the amplifying unit;

a second address generating unit that generates a second address different from the first address based on a previous input signal which is the input signal to be previously input to the amplifying unit;

a distortion compensating unit that obtains the distortion compensation coefficient corresponding to a combination of the first and second addresses from each of the distortion compensation coefficient storage units and performs a pre-distortion processing for the current input signal to be input to the amplifying unit using the obtained distortion compensation coefficient;

a bandwidth obtaining unit that obtains a bandwidth of the current input signal; and a restriction instructing unit that instructs the second address generating unit to restrict the number of the generated second addresses in a case where the bandwidth of the current input signal is equal to or greater than a predetermined threshold value, wherein the distortion compensating unit obtains the distortion compensation coefficient corresponding to a combination of the first address and the number-restricted second address from each of the distortion compensation coefficient storage units and performs the distortion compensation processing using the obtained distortion compensation coefficient in a case where the number of the second addresses generated by the second address generating unit is restricted.

9. A transmitter comprising:

a transmission signal generating unit that generates a transmission signal;

an amplifying unit that amplifies the transmission signal and outputs the amplified transmission signal through an antenna;

a plurality of distortion compensation coefficient storage units that store distortion compensation coefficients for compensating for a distortion of the amplifying unit by being associated with two different addresses;

a first address generating unit that generates a first address based on a current transmission signal which is the transmission signal to be currently input to the amplifying unit;

a second address generating unit that generates a second address different from the first address based on a previous transmission signal which is the transmission signal to be previously input to the amplifying unit;

a distortion compensating unit that obtains the distortion compensation coefficient corresponding to a combination of the first and second addresses from each of the distortion compensation coefficient storage units and performs a pre-distortion processing for the current transmission signal to be input to the amplifying unit using the obtained distortion compensation coefficient;

a bandwidth obtaining unit that obtains a bandwidth of the current input signal; and an abort instructing unit that instructs the second address generating unit to abort generation of the second address in a case where the bandwidth of the current input signal is equal to or greater than a predetermined threshold value, wherein the distortion compensating unit obtains the distortion compensation coefficient corresponding to the first address from each of the distortion compensation coefficient storage units and performs the pre-distortion processing using the obtained distortion compensation coefficient in a case where the generation of the second address in the second address generating unit is aborted.

10. A distortion compensation method executed by a computer, comprising:

generating a first address based on a current input signal which is an input signal to be currently input to an amplifying unit that amplifies the input signal;

generating a second address different from the first address based on a previous input signal which is the input signal to be previously input to the amplifying unit;

obtaining a distortion compensation coefficient corresponding to a combination of the first and second addresses from each of a plurality of distortion compensation coefficient storage units that store distortion compensation coefficients for compensating for a distortion of the amplifying unit by being associated with two different addresses;

performing a pre-distortion processing for the current input signal to be input to the amplifying unit using the obtained distortion compensation coefficient;

obtaining a bandwidth of the current input signal; and instructing the second address generating to abort generation of the second address in a case where the bandwidth of the current input signal is equal to or greater than a predetermined threshold value, wherein the obtaining further includes obtaining the distortion compensation coefficient corresponding to the first address from each of the distortion compensation coefficient storage units and the performing further includes performing the pre-distortion processing using the obtained distortion compensation coefficient in a case where the generation of the second address at the second address generating is aborted.

11. A transmitter comprising:

a transmission signal generating unit that generates a transmission signal;

an amplifying unit that amplifies the transmission signal and outputs the amplified transmission signal through an antenna;

a plurality of distortion compensation coefficient storage units that store distortion compensation coefficients for compensating for a distortion of the amplifying unit by being associated with two different addresses;

a first address generating unit that generates a first address based on a current transmission signal which is the transmission signal to be currently input to the amplifying unit;

a second address generating unit that generates a second address different from the first address based on a previous transmission signal which is the transmission signal to be previously input to the amplifying unit;

a distortion compensating unit that obtains the distortion compensation coefficient corresponding to a combination of the first and second addresses from each of the distortion compensation coefficient storage units and performs a pre-distortion processing for the current transmission signal to be input to the amplifying unit using the obtained distortion compensation coefficient;

a bandwidth obtaining unit that obtains a bandwidth of the current input signal; and an abort instructing unit that instructs the second address generating unit to abort generation of the second address in a case where the bandwidth of the current input signal is equal to or greater than a predetermined threshold value, wherein the distortion compensating unit obtains the distortion compensation coefficient corresponding to the first address from each of the distortion compensation coefficient storage units and performs the pre-distortion processing using the obtained distortion compensation coefficient in a case where the generation of the second address in the second address generating unit is aborted.

12. A distortion compensation method executed by a computer, comprising:

generating a first address based on a current input signal which is an input signal to be currently input to an amplifying unit that amplifies the input signal;

generating a second address different from the first address based on a previous input signal which is the input signal to be previously input to the amplifying unit;

obtaining a distortion compensation coefficient corresponding to a combination of the first and second addresses from each of a plurality of distortion compensation coefficient storage units that store distortion compensation coefficients for compensating for a distortion of the amplifying unit by being associated with two different addresses;

performing a pre-distortion processing for the current input signal to be input to the amplifying unit using the obtained distortion compensation coefficient;

obtaining a bandwidth of the current input signal; and instructing the second address generating to restrict the number of the generated second addresses in a case where the bandwidth of the current input signal is equal to or greater than a predetermined threshold value, wherein the obtaining further includes obtaining the distortion compensation coefficient corresponding to a combination of the first address and the number-restricted second address from each of the distortion compensation coefficient storage units and the performing further includes performing the distortion compensation processing using the obtained distortion compensation coefficient in a case where the number of the second addresses generated at the second address generating is restricted.

* * * * *